(12) United States Patent
Cameron et al.

(10) Patent No.: US 9,235,022 B2
(45) Date of Patent: Jan. 12, 2016

(54) SYSTEMS, METHODS, AND COMPUTER-READABLE MEDIA FOR THERMALLY MANAGING ELECTRONIC DEVICES USING DYNAMIC OPTICAL COMPONENTS

(71) Applicant: Apple Inc., Cupertino, CA (US)

(72) Inventors: Gordon Cameron, Sunnyvale, CA (US); Ryan Joseph Garrone, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/702,613

(22) Filed: May 1, 2015

(65) Prior Publication Data

US 2015/0234144 A1 Aug. 20, 2015

Related U.S. Application Data

(63) Continuation of application No. 13/046,378, filed on Mar. 11, 2011, now Pat. No. 9,052,428.

(51) Int. Cl.
*G02B 7/00* (2006.01)
*H05K 7/20* (2006.01)

(52) U.S. Cl.
CPC ............ *G02B 7/008* (2013.01); *H05K 7/20427* (2013.01)

(58) Field of Classification Search
CPC ....................................................... G02B 7/008
USPC .......................................... 359/512; 219/219
See application file for complete search history.

(56) References Cited

U.S. PATENT DOCUMENTS

| 5,452,121 | A  | * | 9/1995 | Hilgeman ...................... 359/260 |
| 6,559,903 | B2 | * | 5/2003 | Faris et al. ....................... 349/16 |
| 7,026,602 | B2 | * | 4/2006 | Dausch .......................... 250/226 |
| 2004/0095523 | A1 | * | 5/2004 | Li et al. ............................ 349/86 |
| 2007/0179239 | A1 | * | 8/2007 | Li ................................. 524/497 |
| 2008/0048101 | A1 | * | 2/2008 | Romig et al. .................. 250/221 |
| 2015/0234144 | A1 | * | 8/2015 | Cameron et al. .............. 219/219 |

* cited by examiner

*Primary Examiner* — Jennifer L. Doak
(74) *Attorney, Agent, or Firm* — Downey Brand LLP

(57) ABSTRACT

Systems, methods, and computer-readable media for thermally managing electronic devices using dynamic optical components are provided. At least one of the reflectance and the transmittance of incident electromagnetic radiation of a dynamic optical component on an electronic device may be adjusted based on a detected variable device characteristic of the device, such as a temperature of a device component. By adjusting the reflectance and/or the transmittance of the dynamic optical component, different portions of the incident electromagnetic radiation may be directed from the dynamic optical component for changing the variable device characteristic.

20 Claims, 4 Drawing Sheets

SYSTEMS, METHODS, AND COMPUTER-READABLE MEDIA FOR THERMALLY MANAGING ELECTRONIC DEVICES USING DYNAMIC OPTICAL COMPONENTS

CROSS-REFERENCE TO RELATED APPLICATIONS

This application is a continuation of U.S. application Ser. No. 13/046,378, filed Mar. 11, 2011, entitled "SYSTEMS, METHODS, AND COMPUTER-READABLE MEDIA FOR THERMALLY MANAGING ELECTRONIC DEVICES USING DYNAMIC OPTICAL COMPONENTS," the content of which is incorporated herein by reference in its entirety for all purposes.

FIELD

This can relate to systems, methods, and computer-readable media for thermally managing electronic devices and, more particularly, to systems, methods, and computer-readable media for thermally managing electronic devices using dynamic optical components.

BACKGROUND

Electronic devices, such as desktop computers and portable media players, often include various electrical components and mechanical components, and each component may have its own acceptable range of operating temperatures within which the component may operate effectively. A component's operating temperature may be changed by the operation of the component, the operation of proximal components, and/or the ambient temperature of the electronic device. When the operating temperature of such a component moves outside its acceptable range of operating temperatures, the component may fail and/or cause damage to the electronic device.

SUMMARY

Systems, methods, and computer-readable media for thermally managing electronic devices using dynamic optical components are provided.

For example, in some embodiments, there is provided a method for thermally managing an electronic device. The method may include detecting a variable device characteristic of the electronic device and, based on the detected variable device characteristic, adjusting at least one of the reflectance and the transmittance of incident electromagnetic radiation of a dynamic optical component of the electronic device.

In other embodiments, there is provided an electronic device that may include a sensor configured to detect a variable device characteristic and a dynamic optical component that may be configured to adjust the amount of incident electromagnetic radiation transmitted through the dynamic optical component based on the detected variable device characteristic.

In yet other embodiments, there is provided a method for thermally managing an electronic device that includes determining the temperature of a dynamic optical component of the electronic device when the temperature of a device component of the electronic device is a first constraint temperature of an operating temperature range of the device component. Then, the method includes configuring the dynamic optical component to be in a first optical state when the temperature of the dynamic optical component is less than the determined temperature and configuring the dynamic optical component to be in a second optical state when the temperature of the dynamic optical component is greater than the determined temperature.

In still yet other embodiments, there is provided an electronic device that may include a housing having at least one wall that may define a cavity. The electronic device may also include a temperature sensor for detecting an internal temperature within the cavity, and a dynamic optical component that may be in a first optical state when the internal temperature is detected to be below a first temperature threshold and that may be in a second optical state when the internal temperature is detected to be above the first temperature threshold.

In still yet other embodiments, there is provided computer-readable media for controlling an electronic device. The computer-readable media may include computer-readable code recorded thereon for detecting a variable device characteristic of the electronic device and, based on the detected variable device characteristic, adjusting the reflectivity of incident electromagnetic radiation of a dynamic optical component of the electronic device.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout.

DETAILED DESCRIPTION

Systems, methods, and computer-readable media for thermally managing electronic devices using dynamic optical components are provided and described with reference to FIGS. 1-4.

A dynamic optical component of an electronic device may be adjusted to change the amount of incident electromagnetic radiation that is reflected and/or transmitted by the dynamic optical component. This adjustment may be based on a detected variable characteristic of the electronic device such that the adjusted reflectance and/or transmittance may change the variable characteristic. For example, a detected variable characteristic may be a temperature of a particular component or location within the electronic device. When that temperature is determined to have risen above a particular threshold, the amount of incident electromagnetic radiation that is reflected and/or transmitted by the dynamic optical component may be accordingly adjusted so as to reduce the temperature down below the particular threshold.

The variable characteristic may be detected by a sensor within a cavity defined by a housing of the electronic device and the dynamic optical component may be adjusted to change the reflectance and/or transmittance of incident electromagnetic radiation received from a radiation source external to the cavity (e.g., the sun or any other source that may affect the ambient temperature of the device). The dynamic optical component may be provided as a coating on a surface of the housing or within an opening through the housing for transmitting at least a portion of the incident electromagnetic radiation into the cavity. In some embodiments, when the detected variable device characteristic is a cavity temperature that needs to be lowered, the transmittance of at least a portion of the incident electromagnetic radiation may be decreased such that less electromagnetic radiation may be passed through the dynamic optical component and into the cavity. For example, the transmittance of the infrared spectrum band of the incident electromagnetic radiation may be decreased, such that less of the heat component of that infrared radiation maybe able to affect the cavity temperature.

Figure 1:
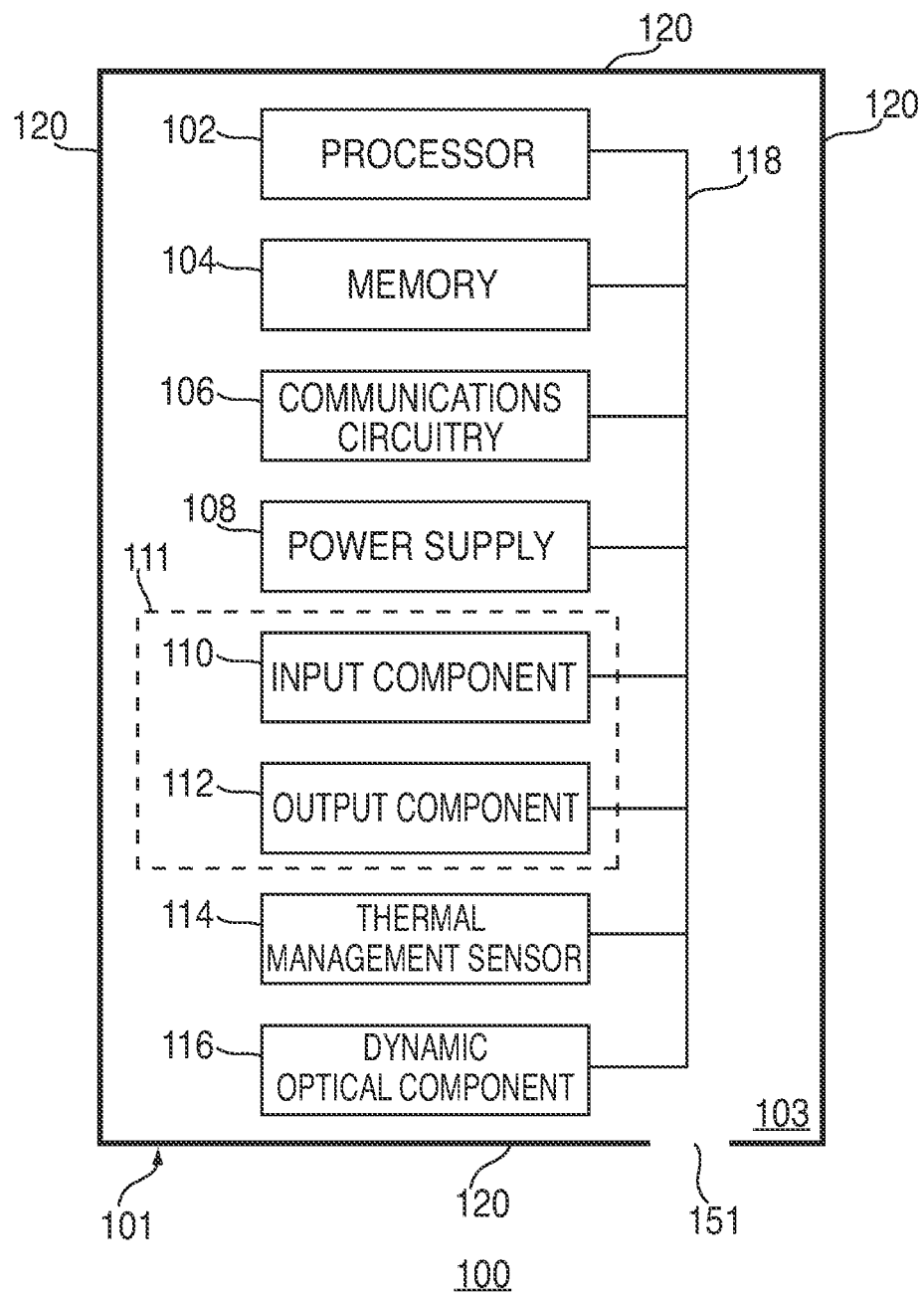
FIG. 1 is a schematic view of an illustrative electronic device in accordance with some embodiments of the invention.

FIG. 1 is a schematic view of an illustrative electronic device 100 that may use one or more dynamic optical components for thermally managing device 100 in accordance with some embodiments of the invention. Electronic device 100 may be any portable, mobile, or hand-held electronic device configured to be used wherever its user travels. Alternatively, electronic device 100 may not be portable at all, but may instead be generally stationary. Electronic device 100 can include, but is not limited to, a music player (e.g., an iPod™ available by Apple Inc. of Cupertino, Calif.), video player, still image player, game player, other media player, music recorder, movie or video camera or recorder, still camera, other media recorder, radio, medical equipment, domestic appliance, transportation vehicle instrument, musical instrument, calculator, cellular telephone (e.g., an iPhone™ available by Apple Inc.), other wireless communication device, personal digital assistant, remote control, pager, computer (e.g., a desktop, laptop, tablet, server, etc.), monitor, television, stereo equipment, set up box, set-top box, boom box, modem, router, printer, or any combination thereof. In some embodiments, electronic device 100 may perform a single function (e.g., a device dedicated to playing music) and, in other embodiments, electronic device 100 may perform multiple functions (e.g., a device that plays music and receives and transmits telephone calls).

Electronic device 100 may include a processor 102, memory 104, communications circuitry 106, power supply 108, input component 110, output component 112, thermal management sensor 114, and dynamic optical component 116. Electronic device 100 may also include a bus 118 that may provide one or more wired or wireless communication links or paths for transferring data and/or power to, from, or between various other components of device 100. In some embodiments, one or more components of electronic device 100 may be combined or omitted. Moreover, electronic device 100 may include other components not combined or included in FIG. 1. For example, electronic device 100 may include a compass, positioning circuitry, or several instances of the components shown in FIG. 1. For the sake of simplicity, only one of each of the components is shown in FIG. 1.

Memory 104 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 104 may include cache memory, which may be one or more different types of memory used for temporarily storing data for electronic device applications. Memory 104 may be any machine-readable medium or computer-readable medium and may store media data (e.g., music and image files), software (e.g., for implementing functions on device 100), firmware, preference information (e.g., media playback preferences), lifestyle information (e.g., food preferences), exercise information (e.g., information obtained by exercise monitoring equipment), transaction information (e.g., information such as credit card information), wireless connection information (e.g., information that may enable device 100 to establish a wireless connection), subscription information (e.g., information that keeps track of podcasts or television shows or other media a user subscribes to), contact information (e.g., telephone numbers and e-mail addresses), calendar information, any other suitable data, or any combination thereof.

Communications circuitry 106 may be provided to allow device 100 to communicate with one or more other electronic devices or servers using any suitable communications protocol. For example, communications circuitry 106 may support Wi-Fi (e.g., an 802.11 protocol), Ethernet, Bluetooth™, high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any other communications protocol, or any combination thereof. Communications circuitry 106 may also include circuitry that can enable device 100 to be electrically coupled to another device (e.g., a host computer or an accessory device) and communicate with that other device, either wirelessly or via a wired connection.

Power supply 108 may provide power to one or more of the other components of device 100. In some embodiments, power supply 108 can be coupled to a power grid (e.g., when device 100 is not acting as a portable device or when it is being charged at an electrical outlet). In some embodiments, power supply 108 can include one or more batteries for providing power (e.g., when device 100 is acting as a portable device). As another example, power supply 108 can be configured to generate power from a natural source (e.g., power supply 108 may include one or more solar cells for generating solar power).

One or more input components 110 may be provided to permit a user to interact or interface with device 100. For example, an input component 110 can take a variety of forms, including, but not limited to, a touch pad, dial, click wheel, scroll wheel, touch screen, one or more buttons (e.g., a keyboard), mouse, joy stick, track ball, microphone, camera, proximity sensor, light detector, motion sensor, and combinations thereof. Each input component 110 can be configured to provide one or more dedicated control functions for making selections or issuing commands associated with operating device 100.

Electronic device 100 may also include one or more output components 112 that may present information (e.g., graphical, audible, and/or tactile information) to a user of device 100. For example, an output component 112 can take a variety of forms, including, but not limited to, audio speakers, headphones, audio line-outs, antennas, infrared ports, rumblers, vibrators, and combinations thereof.

As another example, electronic device 100 may include a visual display as an output component 112 for presenting visual data to a user. In some embodiments, such a display may be embedded in device 100 or coupled to device 100 (e.g., a removable display), and may include, for example, a liquid crystal display ("LCD"), a light emitting diode ("LED") display, an organic light-emitting diode ("OLED")

display, a surface-conduction electron-emitter display ("SED"), a carbon nanotube display, a nanocrystal display, any other suitable type of display, or combinations thereof. Alternatively, such a display can include a movable display or a projecting system for providing a display of content on a surface remote from electronic device 100, such as, for example, a video projector, a head-up display, or a three-dimensional (e.g., holographic) display. As another example, such a display may include a digital or mechanical viewfinder, such as a viewfinder of the type found in compact digital cameras, reflex cameras, or any other suitable still or video camera.

It should be noted that one or more input components and/or one or more output components may sometimes be referred to collectively herein as an input/output ("I/O") component or I/O interface. For example, as shown in FIG. 1, input component 110 and output component 112 may sometimes be a single I/O component 111, such as a touch screen, that may receive input information through a user's touch of a display screen and that may also provide visual information to a user via that same display screen.

Electronic device 100 may also include one or more dynamic optical components 116. Each dynamic optical component 116 may be modified to adjust its reflectance, transmittance, and/or absorptance of incident electromagnetic radiation. In some embodiments, dynamic optical component 116 may be modified to adjust the reflectance of a certain portion of incident electromagnetic radiation independently from the reflectance of another portion of the incident electromagnetic radiation. For example, dynamic optical component 116 may be modified to adjust its reflectance of the infrared radiation spectrum portion of incident electromagnetic radiation while not adjusting its reflectance of the visible light radiation spectrum portion of the incident electromagnetic radiation. By adjusting the reflectance of a dynamic optical component 116, the amount of incident electromagnetic radiation transmitted through the dynamic optical component 116 may be adjusted as well. Therefore, by adjusting the amount of incident electromagnetic radiation that may be transmitted through a dynamic optical component 116, the amount of the thermal radiation component or heat energy component of the incident electromagnetic radiation transmitted through the dynamic optical component 116 may also be adjusted.

As described in more detail below, by placing a dynamic optical component 116 in between another component of device 100 and a source of electromagnetic radiation, the adjustment of the reflectance of the dynamic optical component 116 may control how much of the heat of the incident electromagnetic radiation may be passed through the dynamic optical component 116 and passed onto or received by the other component of device 100. It is to be understood that, although dynamic optical component 116 may often be described herein as having an adjustable reflectance, dynamic optical component 116 may similarly be described as having an adjustable transmittance and/or an adjustable absorptance. For example, the reflectance of a dynamic optical component 116 may be the fraction or percent of a particular frequency or wavelength of incident electromagnetic radiation that is reflected from dynamic optical component 116 without being absorbed or transmitted, while the transmittance of a dynamic optical component 116 may be the fraction or percent of a particular frequency or wavelength of incident electromagnetic radiation that is passed through the dynamic optical component 116 without being absorbed or reflected, and while the absorptance of a dynamic optical component 116 may be the fraction or percent of a particular frequency or wavelength of incident electromagnetic radiation that is absorbed by the dynamic optical component 116 without being reflected or transmitted. Therefore, a dynamic optical component 116 may be dynamically modified to adjust its reflectance, transmittance, and/or absorptance of incident electromagnetic radiation.

For example, a dynamic optical component 116 can take a variety of forms and its reflectance, transmittance, and/or absorptance may be adjusted in a variety of ways, including, but not limited to, a micro-electro-mechanical system ("MEMS") and/or a nano-electro-mechanical system ("NEMS") of one or more shutters that may be at least partially opened or closed, an evaporative liquid that may turn to a reflective gas, any suitable system including one or more chromic elements or substances that may be adjusted in any suitable way, or any combinations thereof. A change in an entity's reflectance, transmittance, and/or absorptance of incident electromagnetic radiation resulting from a process caused by some form of stimulus may be referred to as chromism. Many materials may be chromic, including, but not limited to, conducting polymers, inorganic compounds, and organic compounds. Dynamic optical component 116 may be any suitable type of chromic system whose reflectance, transmittance, and/or absorptance may be adjusted using any suitable stimulus including, but not limited to, a thermochromic system that may be adjusted by temperature change, an electrochromic system that may be adjusted by electrical current, a photochromic system that may be adjusted by exposure to electromagnetic radiation, a gasochromic system that may be adjusted using gas, a solvatochromic system that may be adjusted using solvent polarity, a vapochromic system that may be adjusted using vapor, an ionochromic system that may be adjusted using ions, a halochromic system whose reflectance may be adjusted by pH change, a mechanochromic system that may be adjusted using mechanical action, a tribochromic system that may be adjusted using friction, a piezochromic system that may be adjusted using pressure, a cathodochromic system that may be adjusted using electron beam irradiation, a radiochromic system that may be adjusted using ionizing beam irradiation, a magnetochromic system that may be adjusted using a magnetic field, or any combinations thereof.

For example, in some embodiments, dynamic optical component 116 may be a thermochromic system configured such that when the temperature of a portion of component 116 exceeds or falls below a particular transition temperature, component 116 may transition from a first temperature dependent state to a second temperature dependent state by increasing or decreasing the reflectance, transmittance, and/or absorptance of at least a particular wavelength or band of particular wavelengths of electromagnetic radiation incident to a portion of component 116. Such a thermochromic dynamic optical component 116 may be configured to have more than two temperature dependent states, and different transitions between different sets of temperature dependent states may be stimulated by different transition temperatures. Moreover, different transitions between different sets of temperature dependent states may adjust the reflectance, transmittance, and/or absorptance of different particular wavelengths or different bands of particular wavelengths of electromagnetic radiation incident to a surface of the dynamic optical component 116. In some embodiments, such a thermochromic dynamic optical component 116 may include one or more heating elements for controllably heating or cooling a portion of the dynamic optical component 116 to a temperature above or below a transition temperature to change the temperature dependent state of the dynamic optical component 116. In other embodiments, the temperature of such a thermochromic dynamic optical component 116 may be moved above or below a transition temperature by a heating component of electronic device 100 that may be distinct from the dynamic optical component 116 or by a source of electromagnetic radiation that may be distinct from device 100 altogether, such as the sun or another source external to device 100.

As another example, in some embodiments, dynamic optical component 116 may be an electrochromic system configured such that when an electrical charge applied to a portion of component 116 exceeds or falls below a particular transition charge, component 116 may transition from a first charge dependent state to a second charge dependent state by increasing or decreasing the reflectance, transmittance, and/or absorptance of at least a particular wavelength or band of particular wavelengths of electromagnetic radiation incident to a portion of component 116. Such an electrochromic dynamic optical component 116 may be configured to have more than two charge dependent states, and different transitions between different sets of charge dependent states may be stimulated by different transition charges. Moreover, different transitions between different sets of charge dependent states may adjust the reflectance, transmittance, and/or absorptance of different particular wavelengths or different bands of particular wavelengths of electromagnetic radiation incident to a surface of the dynamic optical component 116.

As yet another example, in some embodiments, dynamic optical component 116 may be a MEMS and/or NEMS system configured such that when a particular transition control input is sent to a portion of the component 116, component 116 may transition from a first control input dependent state to a second control input dependent state by increasing or decreasing the reflectance, transmittance, and/or absorptance of at least a particular wavelength or band of particular wavelengths of electromagnetic radiation incident to a portion of component 116. Such a MEMS and/or NEMS dynamic optical component 116 may be configured to have more than two control input dependent states, and different transitions between different sets of control input dependent states may be stimulated by different transition control inputs. Moreover, different transitions between different sets of control input dependent states may adjust the reflectance, transmittance, and/or absorptance of different particular wavelengths or different bands of particular wavelengths of electromagnetic radiation incident to a surface of the dynamic optical component 116. For example, such a system may include one or more controllable shutters (e.g., a flexible film actuator that may move relative to an element for either allowing or blocking passage of electromagnetic radiation to the element).

Therefore, a dynamic optical component 116 may be a chromic system configured such that when a stimulus characteristic of a portion of component 116 exceeds or falls below a particular transition stimulus value, component 116 may transition from a first stimulus dependent state to a second stimulus dependent state by increasing or decreasing the reflectance, transmittance, and/or absorptance of at least a particular wavelength or band of particular wavelengths of electromagnetic radiation incident to a portion of component 116. The first stimulus dependent state may be a first optical state that may be defined by a first reflectance, a first transmittance, and a first absorptance of incident electromagnetic radiation, while the second stimulus dependent state may be a second optical state that may be defined by a second reflectance, a second transmittance, and a second absorptance of incident electromagnetic radiation, and at least one of the first reflectance and the first transmittance may be different than a respective one of the second reflectance and the second transmittance for a particular incident electromagnetic radiation. Such a chromic dynamic optical component 116 may be configured to have more than two stimulus dependent states, and different transitions between different sets of stimulus dependent states may be stimulated by different transition stimulus values. Moreover, different transitions between different sets of stimulus dependent states may adjust the reflectance, transmittance, and/or absorptance of different particular wavelengths or different bands of particular wavelengths of electromagnetic radiation incident to a surface of the dynamic optical component 116.

Device 100 can be provided with various suitable types of dynamic optical component 116 in various suitable ways. For example, at least a portion of a dynamic optical component 116 with a variable reflectance may be provided as a dye or coating that may be painted or otherwise applied to any suitable surface of device 100. As another example, at least a portion of a dynamic optical component 116 with a variable reflectance may be provided as a flexible film actuator that may be layered over any suitable portion of device 100.

Electronic device 100 may also include one or more thermal management sensors 114. Each sensor 114 may be provided to detect one or more variable device characteristics of electronic device 100, such as a variable characteristic related to a current operation, performance, and/or environmental condition of one or more components or areas of electronic device 100 that may be useful for controlling the thermal management of electronic device 100. For example, each sensor 114 may take various forms, including, but not limited to, a temperature sensor for detecting the temperature of a portion of electronic device 100, a performance analyzer for detecting an application characteristic related to the current operation of one or more components of electronic device 100 (e.g., whether or not power supply 108 is fully charged, what application program is being run by processor 102, etc.), a single-axis or multi-axis accelerometer, an angular rate or inertial sensor (e.g., optical gyroscope, vibrating gyroscope, gas rate gyroscope, or ring gyroscope), a magnetometer (e.g., scalar or vector magnetometer), a pressure sensor, an electromagnetic radiation sensor or light sensor (e.g., ambient light sensor ("ALS"), infrared ("IR") sensor, and the like that may detect a characteristic of electromagnetic radiation being received, transmitted, reflected, and/or absorbed by a dynamic optical component 116), a linear velocity sensor, a thermal sensor, a microphone, a proximity sensor, a capacitive proximity sensor, an acoustic sensor, a sonic or sonar sensor, a radar sensor, an image sensor, a video sensor, a global positioning system ("GPS") detector, a radio frequency ("RF") detector, an RF or acoustic Doppler detector, an RF triangulation detector, an electrical charge sensor, a peripheral device detector, and any combinations thereof. For example, one or more sensors 114 may be used to determine the current operating temperature of a component of device 100, the orientation or velocity of electronic device 100, the amount or type of light, heat, or sound that device 100 is currently being exposed to, and the like.

Processor 102 of device 100 may include any processing circuitry operative to control the operations and performance of one or more components of electronic device 100. In some embodiments, processor 102 may be used to run operating system applications, firmware applications, media playback applications, media editing applications, thermal management applications or any other application or program. For example, processor 102 may load a user interface program or other application program (e.g., a program stored in memory 104 or on another device or server) to determine how data received from one or more device components (e.g., from input component 110 and/or sensor 114) may manipulate the ways in which data may be provided to other components of device 100 (e.g., to output component 112 and/or dynamic optical component 116).

In some embodiments, processor 102 may control the operation of one or more components of electronic device 100 (e.g., control the reflectance of dynamic optical component 116) based on information detected by sensor 114 (e.g., information related to the operating temperature of a component of device 100). Sensor 114 may detect when the operating temperature of power supply 108 moves outside of its operating temperature range, which may be defined by at least one temperature range constraint, such as an upper threshold temperature and a lower threshold temperature. For example, if sensor 114 detects that the operating temperature of power supply 108 has increased above a certain upper threshold temperature of an operating temperature range of power supply 108, processor 102 may be configured to consequentially increase the reflectance of a dynamic optical component 116 that may be positioned between a source of electromagnetic radiation and power supply 108. By increasing the reflectance of such a dynamic optical component 116, less incident electromagnetic radiation from the source may be transmitted through dynamic optical component 116 and towards power supply 108. By decreasing the amount of electromagnetic radiation that may be transmitted towards and/or received by power supply 108 through a dynamic optical component 116, power supply 108 may be less likely to be heated by the electromagnetic radiation and the operating temperature of power supply 108 may be more likely to decrease below the upper threshold temperature of its operating temperature range.

As another example, if sensor 114 detects that the operating temperature of power supply 108 has decreased below a certain lower threshold temperature of an operating temperature range of power supply 108, processor 102 may be configured to consequentially decrease the reflectance of a dynamic optical component 116 that may be positioned between a source of electromagnetic radiation and power supply 108. By decreasing the reflectance of such a dynamic optical component 116, more incident electromagnetic radiation from the source may be transmitted through dynamic optical component 116 and towards power supply 108. By increasing the amount of electromagnetic radiation that may be transmitted towards and/or received by power supply 108 through a dynamic optical component 116, power supply 108 may be more likely to be heated by the electromagnetic radiation and the operating temperature of power supply 108 may be more likely to increase above the lower threshold temperature of its operating temperature range.

Additionally or alternatively, in some embodiments, the performance or mode of a component of electronic device 100 may be altered based on a combination of information detected by one or more sensors 114 and/or a characteristic of dynamic optical component 116, such as the current reflectance of dynamic optical component 116. For example, if sensor 114 detects that the operating temperature of power supply 108 is above a certain upper threshold temperature of an operating temperature range of power supply 108 and it is determined that the reflectivity of dynamic optical component 116 may not be increased, processor 102 may be configured to consequentially reduce or terminate the use of power supply 108 (e.g., until the operating temperature of power supply 108 is below the upper threshold temperature and/or until the reflectivity of dynamic optical component 116 may be increased). By altering the performance or mode of a component of electronic device 100 based wholly, or at least in part, on information detected by sensor 114 and/or a characteristic of dynamic optical component 116, electronic device 100 may better control the thermal management of electronic device 100.

Electronic device 100 may also be provided with a housing 101 that may at least partially enclose one or more of the components of device 100 for protection from debris and other degrading forces external to device 100. In some embodiments, housing 101 may include one or more walls 120 that may at least partially define a cavity 103 within which at least a portion of one or more of the various components of device 100 can be disposed. In some embodiments, housing 101 can support various components of device 100, such as input component 110 and/or output component 112, at the surfaces of walls 120 of housing 101 or within one or more housing openings 151 through the surfaces of walls 120 of housing 101. Housing openings 151 may also allow certain fluids (e.g., air) or other phenomena (e.g., electromagnetic radiation) to pass into or out of cavity 103 (e.g., for helping to manage the temperature of device 100).

In some embodiments, one or more of the components of electronic device 100 may be provided within its own housing (e.g., input component 110 may be an independent keyboard or mouse within its own housing 101 that may wirelessly or through a wire communicate with processor 102, which may similarly be provided within its own housing 101). Housing 101 can be formed from a wide variety of materials including, but not limited to, metals (e.g., steel, copper, titanium, aluminum, and various metal alloys), ceramics, plastics, glass, and any combinations thereof. Housing 101 may also help to define the shape or form of electronic device 100. That is, the contour of housing 101 may embody the outward physical appearance of electronic device 100.

Figure 2:
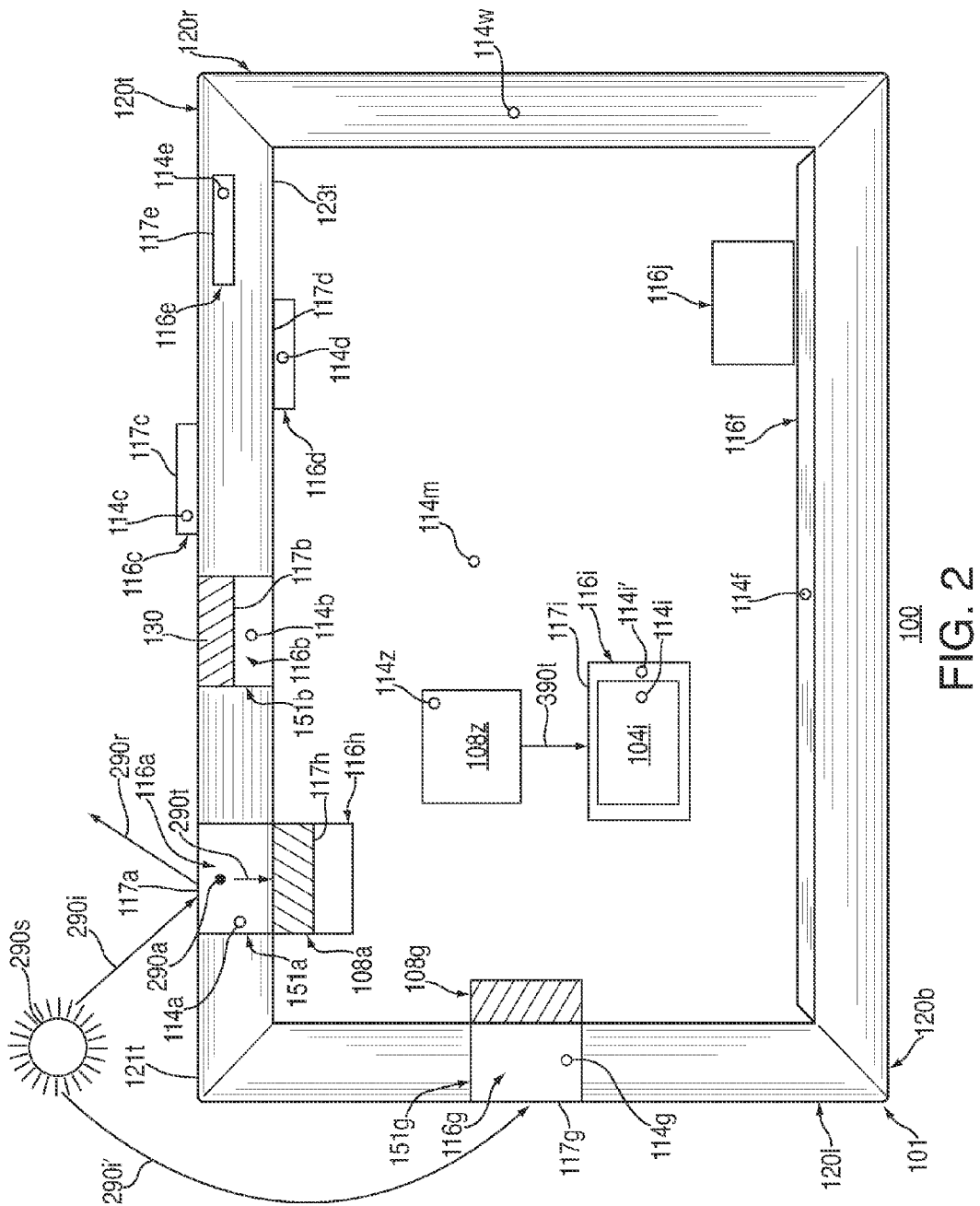
FIG. 2 is a partial cross-sectional view of a portion of the electronic device of FIG. 1 in accordance with some embodiments of the invention.

One or more dynamic optical components 116 can be positioned in various ways with respect to sources of electromagnetic radiation, housing 101, and various other components of device 100 to thermally manage device 100. In some embodiments, a dynamic optical component 116 may be positioned adjacent to or at least partially within an opening 151 through a wall 120 of housing 101 to adjust the amount of electromagnetic radiation external to device 100 that may pass into cavity 103 through that opening 151. As shown in FIG. 2, for example, at least a portion of a dynamic optical component 116a may be positioned within an opening 151a through a top wall 120t of housing 101. In some embodiments, dynamic optical component 116a may be positioned with respect to opening 151a such that an external surface 117a of dynamic optical component 116a may be substantially flush with an external wall surface 121t of top wall 120t about opening 151a. This may provide a smooth transition between external wall surface 121t and dynamic optical component 116a.

When positioned within opening 151a through top wall 120t of housing 101, external surface 117a of dynamic optical component 116a may be exposed to electromagnetic radiation external to device 100. For example, as shown in FIG. 2, incoming or incident electromagnetic radiation 290i may strike external surface 117a of dynamic optical component 116a. Incident electromagnetic radiation 290i may be any type of electromagnetic radiation across any portion or the entirety of the electromagnetic spectrum, and may be generated by any electromagnetic radiation source. For example, incident electromagnetic radiation 290i may be solar electromagnetic radiation emitted by the sun (e.g., electromagnetic radiation source 290s). It is to be understood, however, that incident electromagnetic radiation 290i may be provided by any suitable electromagnetic radiation source 290s. As described above with respect to dynamic optical component 116 of FIG. 1, dynamic optical component 116a may be controlled to adjust the percent of one or more various particular frequencies or wavelengths of incident electromagnetic radiation 290i that is reflected away from dynamic optical component 116a as reflected electromagnetic radiation 290r, that is transmitted through dynamic optical component 116a as transmitted electromagnetic radiation 290t, and that is absorbed by dynamic optical component 116a as absorbed electromagnetic radiation 290a. Therefore, the amount of incident electromagnetic radiation 290i allowed into cavity 103 of device 100 through dynamic optical component 116a as transmitted electromagnetic radiation 290t may be varied to thermally manage components of device 100 within cavity 103.

As another example, as also shown in FIG. 2, at least a portion of a dynamic optical component 116b may be positioned within an opening 151b through top wall 120t of housing 101. However, unlike dynamic optical component 116a, dynamic optical component 116b may be positioned with respect to opening 151b such that an external surface 117b of dynamic optical component 116b may not be substantially flush with external wall surface 121t of top wall 120t about opening 151b. Instead, a protective layer 130 may be provided over external surface 117b of dynamic optical component 116b. Protective layer 130 may be any suitable protective material that may also be transparent or at least translucent for passing at least some electromagnetic radiation therethrough. Layer 130 may protect surface 117b of dynamic optical component 116b from any degrading forces external to device 100 while still exposing dynamic optical component 116b to at least a portion of electromagnetic radiation external to device 100 (e.g., at least a portion of electromagnetic radiation provided by source 290s) that may pass through layer 130. For example, protective layer 130 may be a scratch resistant glass.

In some embodiments, at least a portion of top wall 120t itself may be transparent or at least translucent for allowing electromagnetic radiation to pass therethrough, such that a dynamic optical component 116 need not be positioned with respect to an opening through wall 120. For example, as also shown in FIG. 2, an external surface 117c of a dynamic optical component 116c may be positioned on top of external wall surface 121t of top wall 120t, such that at least a portion of electromagnetic radiation transmitted through dynamic optical component 116c may also pass through top wall 120t and into cavity 103. Likewise, as also shown in FIG. 2, an external surface 117d of a dynamic optical component 116d may be positioned under an internal wall surface 123t of top wall 120t, such that electromagnetic radiation passed from external wall surface 121t, through top wall 120t, and to internal wall surface 123t may be received as incident electromagnetic radiation at external surface 117d of dynamic optical component 116d for adjustable transmission into cavity 103. As yet another example, as also shown in FIG. 2, a dynamic optical component 116e may be positioned within top wall 120t between external wall surface 121t and internal wall surface 123t, such that at least a portion of electromagnetic radiation passed through external wall surface 121t may be received as incident electromagnetic radiation at external surface 117e of dynamic optical component 116e for adjustable transmission through dynamic optical component 116e and then internal wall surface 123t into cavity 103.

One or more dynamic optical components 116 may be provided along various portions of one or more walls 120 of housing 101. In some embodiments, only certain portions of a wall 120 may be provided with one or more dynamic optical components 116 for adjusting the amount of electromagnetic radiation external to device 100 that may be transmitted into cavity 103 through that wall (e.g., as shown in FIG. 2 with respect to top wall 120t and dynamic optical components 116a-116e along different portions of top wall 120t). In other embodiments, an entire wall 120 may be provided with one or more dynamic optical components 116, such that all electromagnetic radiation external to device 100 that may be transmitted into cavity 103 through that wall may be selectively adjusted. For example, as also shown in FIG. 2, a bottom wall 120b of housing 101 may be provided with a dynamic optical component 116f that may span the entire area of bottom wall 120b. As another example, an opening 151g may be provided through left-side wall 120l of housing 101 and a dynamic optical component 116g may be provided within opening 151g such that an external surface 117g may be exposed to incident electromagnetic radiation external to device 100 (e.g., incident electromagnetic radiation 290i from source 290s). In yet other embodiments, an entire wall 120 may not be provided with any dynamic optical components 116. For example, as shown in FIG. 2, a right-side wall 120r may be provided with no dynamic optical component 116.

As mentioned, device 100 can be provided with various suitable types of dynamic optical component 116 in various suitable ways. For example, at least a portion of a dynamic optical component 116 with a variable reflectance may be provided as a dye or coating that may be painted or otherwise applied to any suitable surface of device 100 (e.g., dynamic optical component 116d may be provided as a coating or dye on internal wall surface 123t of top wall 120t). As yet another example, at least a portion of a dynamic optical component 116 with a variable reflectance may be provided as a flexible film actuator that may be layered over any suitable portion of device 100.

In some embodiments, two dynamic optical components 116 may be aligned with one another, each of which may be configured to have different optical properties. For example, as shown in FIG. 2, a dynamic optical component 116j may be positioned adjacent at least a portion of dynamic optical component 116f. Each one of dynamic optical components 116f and 116j may be controlled by its own stimulus and/or may be configured to have its own reflectance/transmittance/absorptance response to the same stimulus. For example, components 116f and 116j may have different responses to a particular temperature stimulus. By aligning two or more dynamic optical components 116, all electromagnetic radiation transmitted by the portion of a first dynamic optical component adjacent to a second dynamic optical component may be provided as incident electromagnetic radiation to the second optical component that is aligned with the portion of the first dynamic optical component. For example, two dynamic optical components 116 may be provided as two coatings layered on top of one another, and each dynamic optical component may adjust its reflectance/transmittance/absorptance independently of the other dynamic optical component.

In order to thermally manage device 100, the operation of one or more components of device 100 may be controlled based on information detected by one or more sensors 114 (e.g., information related to the operating temperature of a component or the reflectance/transmittance of a component). For example, a battery component 108z of power supply 108 may only function properly if it is operating at an operating temperature within an acceptable operating temperature range that may be defined by a minimum operating temperature and a maximum operating temperature. Therefore, one or more sensors 114 (e.g., sensor 114z of FIG. 2) may be provided to detect the operating temperature of battery component 108z. If the operating temperature of battery component 108z is detected to have exited its acceptable operating temperature range or to have reached a threshold temperature deemed related to its acceptable operating temperature range (e.g., within 5.degree. Celsius of exiting its acceptable operating temperature range), or if the detected operating temperature is to be changed for any other suitable reason, device 100 may be configured to alter the operation of one or more components.

For example, when it is detected that the temperature of battery component 108z has risen above or may be about to rise above its upper threshold temperature of an operating temperature range (e.g., 45.degree. Celsius), or if the detected operating temperature is to be lowered for any other suitable reason, device 100 may be configured to alter the operation of one or more components in order to reduce the operating temperature of battery component 108z. In some embodiments, device 100 may be configured to adjust the reflectance/transmittance of one or more of dynamic optical components 116a-116g such that less electromagnetic radiation may be passed therethrough for heating battery component 108z. As just one example, the transmittance of dynamic optical component 116a may be reduced such that the heat component of transmitted electromagnetic radiation 290t may be reduced. This may reduce the internal temperature of cavity 103 and the operating temperature of battery component 108z.

Alternatively, when it is detected that the temperature of battery component 108z has fallen below or may be about to fall below its lower threshold temperature of an operating temperature range, or if the detected operating temperature is to be raised for any other suitable reason, device 100 may be configured to alter the operation of one or more components in order to increase the operating temperature of battery component 108z. In some embodiments, device 100 may be configured to adjust the reflectance/transmittance of one or more of dynamic optical components 116a-116g such that more electromagnetic radiation may be passed therethrough for heating battery component 108z. As just one example, the transmittance of dynamic optical component 116a may be increased such that the heat component of transmitted electromagnetic radiation 290t may be increased. This may increase the internal temperature of cavity 103 and the operating temperature of battery component 108z.

In some embodiments, device 100 may include sensors 114 for detecting various characteristics of its dynamic optical components 116. For example, each one of dynamic optical components 116a-116g of FIG. 2 may include at least one respective sensor 114 associated therewith (e.g., sensors 114a-114g). In other embodiments, a dynamic optical component 116 may not be provided with its own dedicated sensor 114, and a single sensor 114 may be used to detect characteristics of multiple dynamic optical components 116. These detected characteristics of dynamic optical components 116 by sensors 114 may be used to best determine how to thermally manage device 100.

For example, sensor 114a of dynamic optical component 116a may be configured to detect the temperature or spectrum content of its transmitted electromagnetic radiation 290t, the temperature or spectrum content of its absorbed electromagnetic radiation 290a, the temperature or spectrum content of its reflected electromagnetic radiation 290r, the temperature or spectrum content of its incident electromagnetic radiation 290i, and/or any other suitable characteristic of any of those radiations and/or any other suitable characteristic of dynamic optical component 116a itself (e.g., the switching time required by component 116a to switch between its current state and a new state). Therefore, when it is detected that the temperature of battery component 108z has fallen below or may be about to fall below its minimum operating temperature, device 100 may be configured to adjust the reflectance/transmittance of one or more of dynamic optical components 116a-116a based on one or more of the detected characteristics of one or more of those dynamic optical components 116. For example, if sensor 114a detects that dynamic optical component 116a may not be adjusted to transmit electromagnetic radiation capable of increasing the operating temperature of battery component 108z, but sensor 114g detects that dynamic optical component 116g may be adjusted to transmit electromagnetic radiation capable of increasing the operating temperature of battery component 108z, then device 100 may be configured to adjust the transmittance of dynamic optical component 116g but not to adjust the transmittance of dynamic optical component 116a.

Moreover, the relative positions of or distances between each dynamic optical component 116 with respect to a portion of device 100 that may need to be thermally managed (e.g., battery component 108z) may be used to determine which dynamic optical components 116 may be adjusted to thermally manage device 100 most effectively. For example, if it is determined that dynamic optical component 116a and dynamic optical component 116e are each capable of being adjusted to manage the operating temperature of battery component 108z, but that battery component 108z is closer to dynamic optical component 116a than to dynamic optical component 116e, then device 100 may be configured to adjust the transmittance of dynamic optical component 116a but not to adjust the transmittance of dynamic optical component 116e.

A dynamic optical component 116 may be specifically positioned with respect to a particular component of device 100 for altering the function of that component, and that functional relationship between components may be used to determine which dynamic optical components 116 may be adjusted to thermally manage device 100 most effectively. For example, as shown in FIG. 2, a solar cell component 108a of power supply 108 may be positioned adjacent dynamic optical component 116a, such that transmitted electromagnetic radiation 290t provided by dynamic optical component 116a may be received by solar cell component 108a for generating power for device 100. In some embodiments, solar cell component 108a may be coupled to battery component 108z such that power generated by solar cell component 108a from transmitted electromagnetic radiation 290t may be stored in battery component 108z. Therefore, as the transmittance of dynamic optical component 116a is adjusted, the power generation capabilities of solar cell component 108a may also be adjusted. A characteristic of such a functional relationship between dynamic optical component 116a and power supply 108 (e.g., the effectiveness or ability of solar cell component 108a to convert various particular wavelengths or bands of wavelengths of transmitted electromagnetic radiation 290t into power, the amount of power being generated by solar cell component 108a, the amount of power stored in battery component 108z, the amount of power being drawn from battery component 108z, etc.) may be used to determine which dynamic optical components 116 may be adjusted and how they may be adjusted to thermally manage device 100 most effectively.

As just one example, the amount of power stored in battery component 108z may be a characteristic of a functional relationship between dynamic optical component 116a and power supply 108 that may be used by device 100 to determine whether or not the transmittance of dynamic optical component 116a may be adjusted to thermally manage device 100 most effectively. For example, device 100 may be configured to compare the battery charging benefits of transmitted electromagnetic radiation 290t of dynamic optical component 116a with the battery heating drawbacks of transmitted electromagnetic radiation 290t of dynamic optical component 116a when it is detected that the temperature of battery component 108z is to be reduced. Based on this comparison of the relative needs to reduce the operating temperature of battery component 108z and to increase the power stored in battery component 108z, device 100 may be configured to increase, decrease, or not adjust the transmittance of incident electromagnetic radiation 290i as transmitted electromagnetic radiation 290t by dynamic optical component 116a. In some embodiments, device 100 may also be configured to make this adjustment determination based on one or more detected characteristics of dynamic optical component 116a, such as its distance from battery component 108z, the temperature of incident electromagnetic radiation 290i at dynamic optical component 116a, and the like (e.g., as detected by sensor 114a).

As another example, the particular band or bands of transmitted electromagnetic radiation 290t that solar cell component 108a may convert into power may be a characteristic of a functional relationship between dynamic optical component 116a and power supply 108 that may be used by device 100 to determine whether or not the transmittance of dynamic optical component 116a may be adjusted to thermally manage device 100 most effectively. For example, when it is detected that the temperature of battery component 108z is to be reduced, device 100 may be configured not only to compare the battery charging benefits with the battery heating drawbacks of a first particular spectrum band of electromagnetic radiation that may be provided in transmitted electromagnetic radiation 290t (e.g., an infrared spectrum band), but also to compare the battery charging benefits with the battery heating drawbacks of a second particular spectrum band of electromagnetic radiation that may be provided in transmitted electromagnetic radiation 290t (e.g., a visible light spectrum band). Based on these comparisons of the relative needs to reduce the operating temperature of battery component 108z and to increase the power stored in battery component 108z using different, spectrum bands of electromagnetic radiation, device 100 may be configured to increase, decrease, or not adjust the transmittance of incident electromagnetic radiation 290i as transmitted electromagnetic radiation 290t by dynamic optical component 116a for different spectrum bands of radiation independently and by different amounts. For example, device 100 may be configured to adjust dynamic optical component 116a not only to increase its transmittance of electromagnetic radiation in the infrared spectrum band by a first amount but also to decrease its transmittance of electromagnetic radiation in the visible light spectrum band by a second amount. In some embodiments, this adjustment of dynamic optical component 116a may thermally manage power supply 108 effectively, as most of the heat component of incident electromagnetic radiation 290i may be contained in the visible light spectrum, whereas solar cell component 108a may be able to generate as much power from electromagnetic radiation in the infrared spectrum as from electromagnetic radiation in the visible light spectrum.

Therefore, device 100 may be configured to independently control the reflectance/transmittance/absorptance of different spectrum bands of a dynamic optical component 116, which may allow device 100 to thermally manage each of its components in a flexible and efficient way. Each spectrum band may be defined by any suitable wavelength or range of wavelengths of electromagnetic radiation, and need not be limited to commonly defined spectrum bands, such as the infrared spectrum band and the visible light spectrum band.

As an additional example, as shown in FIG. 2, a solar cell component 108g of power supply 108 may be positioned adjacent dynamic optical component 116g, such that electromagnetic radiation transmitted by dynamic optical component 116g may be received by solar cell component 108g for generating power for device 100. For example, solar cell component 108g may be coupled to battery component 108z such that power generated by each one of solar cell components 108a and 108g may be stored in battery component 108z. Therefore, as the transmittance of dynamic optical component 116g is adjusted, the power generation capabilities of solar cell component 108g may also be adjusted. A characteristic of such a functional relationship between dynamic optical component 116g and power supply 108 (e.g., the particular band or bands of electromagnetic radiation that solar cell component 108g may convert into power, the amount of power being generated by solar cell component 108g, the amount of power stored in battery component 108z, the amount of power being drawn from battery component 108z, etc.) may be used to determine which dynamic optical components 116 may be adjusted to thermally manage device 100 most effectively.

As just one example, the amount of power stored in battery component 108z may be a characteristic of a functional relationship between dynamic optical component 116a and power supply 108 as well as a characteristic of a functional relationship between dynamic optical component 116g and power supply 108. Each one of these functional relationship characteristics may be used by device 100 to determine whether or not the transmittance of dynamic optical component 116a and/or the transmittance of dynamic optical component 116g may be adjusted to thermally manage device 100 most effectively. Additionally or alternatively, detected characteristics of each one of independent dynamic optical components 116a and 116g may be used to determine whether or not the transmittance of dynamic optical component 116a and/or the transmittance of dynamic optical component 116g may be adjusted to thermally manage device 100 most effectively. For example, device 100 may be configured to compare the battery charging benefits and battery heating drawbacks of the electromagnetic radiation transmitted by each one of dynamic optical components 116a and 116g when it is detected that the temperature of battery component 108z is to be reduced. Based not only on this comparison of the relative needs to reduce the operating temperature of battery component 108z and to increase the power stored in battery component 108z, but also on a comparison of characteristics of independent dynamic optical components 116a and 116g (e.g., their relative distances to battery component 108z, the relative characteristics of their incident electromagnetic radiations, etc.), device 100 may be configured not only to increase, decrease, or not adjust the transmittance of electromagnetic radiation by dynamic optical component 116a, but also to increase, decrease, or not adjust the transmittance of electromagnetic radiation by dynamic optical component 116g.

In some embodiments, in addition to or as an alternative to providing dynamic optical component 116a between electromagnetic radiation source 290s and solar cell component 108a, a dynamic optical component 116 may be provided between solar cell component 108a and an internal portion of device 100. For example, as shown in FIG. 2, a dynamic optical component 116h may be provided between solar cell component 108a and an internal portion of device 100, such that an external surface 117h of dynamic optical component 116h may receive as incident electromagnetic radiation any electromagnetic radiation that is passed through solar cell component 108a. Unlike the placement of dynamic optical component 116a, the placement of dynamic optical component 116k with respect to solar cell component 108a may not allow for dynamic optical component 116k to vary the amount of electromagnetic radiation received by solar cell component 108a from electromagnetic radiation source 290s. Therefore, the reflectance/transmittance of dynamic optical component 116k may be adjusted to thermally manage portions of device 100 (e.g., the operating temperature of battery component 108z) without affecting a functional relationship between solar cell component 108a and battery component 108z (e.g., the amount of power stored in battery component 108z by solar cell component 108a).

In other embodiments, rather than thermally managing device 100 in response to detecting an operating temperature of one or more specific device components (e.g., the operating temperature of battery component 108z using sensor 114z), device 100 may be thermally managed in response to detecting a more general characteristic of device 100 that may not be tied to one or more specific components. For example, device 100 may include a sensor 114m that may be positioned near the middle of cavity 103 for detecting a characteristic of that location of device 100 within cavity 103. As another example, device 100 may include a sensor 114 that may be positioned adjacent or within a wall of housing 101 (e.g., sensor 114w within right-side wall 120r) for detecting a characteristic of that location of housing 101 of device 100. Sensor 114m and sensor 114w may each be configured to detect any suitable variable characteristic of device 100 at its location, such as a general operating temperature of device 100 at that location, a sound amplitude detected at that location, and the like. Any characteristic detected by sensor 114m or sensor 114w may be used along with any other characteristic detected by any other sensor 114 in order to determine whether or not to adjust the reflectance, transmittance, and/or absorptance of one or more dynamic optical components 116 for thermally or otherwise managing device 100.

In some embodiments, in addition to or as an alternative to providing a dynamic optical component 116 adjacent to or within an opening 151 of a wall 120 of housing 101 of device 100, a dynamic optical component 116 may be provided adjacent to or about any suitable device component positioned at least partially within cavity 103 of housing 101. For example, as shown in FIG. 2, a dynamic optical component 116i may be provided adjacent to at least one surface of memory component 104i such that an external surface 117i of dynamic optical component 116i may be exposed to incident electromagnetic radiation that is within cavity 103. For example electromagnetic radiation that may be received as incident electromagnetic radiation on external surface 117i of dynamic optical component 116i may be electromagnetic radiation transmitted by another component of device 100 (e.g., transmitted electromagnetic radiation 390t provided by battery component 108z).

Dynamic optical component 116i may be provided to thermally manage at least memory component 104i from such electromagnetic radiation transmitted by another component of device 100. For example, memory component 104i of memory 104 of device 100 may only function properly if it is operating at an operating temperature within an acceptable operating temperature range that may be defined by a lower threshold or a minimum operating temperature and an upper threshold or a maximum operating temperature. Therefore, one or more sensors 114 (e.g., sensor 114i of FIG. 2) may be provided to detect the operating temperature of memory component 104i. If the operating temperature of memory component 104i is detected to have exited its acceptable operating temperature range or to have reached a threshold temperature deemed related to its acceptable operating temperature range (e.g., within 5.degree. Celsius of exiting its acceptable operating temperature range), or if the detected operating temperature is to be changed for any other suitable reason, device 100 may be configured to alter the operation of one or more components.

For example, when it is detected that the temperature of memory component 104i has exceeded or may be about to exceed its maximum operating temperature, or if the detected operating temperature is to be lowered for any other suitable reason, device 100 may be configured to alter the operation of one or more components in order to reduce the operating temperature of memory component 104i. In some embodiments, device 100 may be configured to adjust the reflectance/transmittance of one or more of dynamic optical components 116a-116h such that less electromagnetic radiation may be passed therethrough (e.g., from electromagnetic radiation source 290s) for heating memory component 104i. Additionally or alternatively, device 100 may be configured to adjust the reflectance/transmittance of dynamic optical component 116i such that less electromagnetic radiation may be passed therethrough (e.g., from transmitted electromagnetic radiation 390t provided by battery component 108z or from any other electromagnetic radiation that may be incident to external surface 117i of dynamic optical component 116i) for heating memory component 104i. As just one example, the transmittance of dynamic optical component 116i may be reduced such that the heat component of any electromagnetic radiation transmitted by dynamic memory component 116i towards memory component 104i may be reduced, which may reduce the operating temperature of memory component 104i. As mentioned, in some embodiments, device 100 may include sensors 114 for detecting various characteristics of its dynamic optical components 116. For example, dynamic optical component 116i of FIG. 2 may include at least one respective sensor 114i associated therewith that may be used to detect characteristics of dynamic optical component 116i. These detected characteristics of dynamic optical component 116i by sensor 114i may be used to best determine how to thermally manage device 100.

For example, sensor 114i of dynamic optical component 116i may be configured to detect the temperature or spectrum content of its incident electromagnetic radiation at surface 117i (e.g., electromagnetic radiation 390t transmitted by battery component 108z), the temperature or spectrum content of its absorbed electromagnetic radiation, the temperature or spectrum content of its reflected electromagnetic radiation, the temperature or spectrum content of its transmitted electromagnetic radiation, and/or any other suitable characteristic of any of those radiations and/or any other suitable characteristics of dynamic optical component 116i itself (e.g., the time required to switch component 116i from its current state to a new state). Therefore, when it is detected that the temperature of memory component 104i has fallen below or may be about to fall below its minimum operating temperature, device 100 may be configured to adjust the reflectance/transmittance of dynamic optical component 116i based on one or more of the detected characteristics of dynamic optical component 116i.

As shown in FIG. 2, dynamic optical component 116i may surround memory component 104i, although in other embodiments dynamic optical component 116i may be provided just along one or some of the external surfaces of memory component 104*i*. By providing one or more dynamic optical components 116 surrounding all or even a portion of a device component (e.g., memory component 104*i*), those dynamic optical components 116 may be primarily utilized to thermally manage that device component. Different device components of device 100 may have different acceptable operating temperature ranges and other operating characteristics. For example, battery component 108*z* may operate better at higher temperatures and memory component 104*i* may operate better at relatively lower temperatures. By providing dynamic optical component 116*i* about memory component 104*i*, adjustment of the reflectance/transmittance of dynamic optical component 116*i* may have a much greater effect on the thermal management of memory component 104*i* than on the thermal management of another device component (e.g., battery component 108*z*).

In some embodiments, a dynamic optical component 116 may be configured to have at least one transition stimulus value that is equal to or otherwise based on a known characteristic or operational value of another component of device 100. For example, dynamic optical component 116*i* may be a thermochromic dynamic optical component 116 that may be configured to have a particular transition temperature value that is based on an operating temperature threshold value of memory component 104*i*. Particularly, in some embodiments, a transition temperature value of a thermochromic dynamic optical component 116*i* may be configured to be equal to the upper threshold temperature of the operating temperature range of memory component 104*i*. Therefore, if a surface of dynamic optical component 116*i* is positioned against a surface of memory component 104*i* such that those surfaces of components 116*i* and 104*i* may generally always be at the same temperature, when that shared temperature of components 116*i* and 104*i* exceeds the upper threshold temperature of the operating temperature range of memory component 104*i*, that shared temperature of components 116*i* and 104*i* may also exceed the transition temperature of component 116*i*, such that component 116*i* may transition from a first temperature dependent state to a second temperature dependent state (e.g., to a state that may transmit less electromagnetic radiation towards memory component 104*i*). In such an embodiment, component 116*i* may transition between states directly due to a change in an operating characteristic of memory component 104*i*, and not due to such an operating characteristic of memory component 104*i* being detected by a sensor 114 and then analyzed by device 100 in order to determine whether or not to control component 116*i* to transition between states.

As another example, if a thermochromic dynamic optical component 116*i* is positioned with respect to memory component 104*i* such that their temperatures may differ by a known amount (e.g., by 3.degree. Celsius), then a transition temperature value of dynamic optical component 116*i* may be configured to be different from the upper threshold temperature of the operating temperature range of memory component 104*i* based on that known amount, such that when the temperature of memory component 104*i* reaches its upper threshold temperature, dynamic optical component 116*i* may reach its transitional temperature. For example, dynamic optical component 116*i* may be provided with a sensor 114*i* that may be configured to determine the temperature or any other characteristic of dynamic optical component 116*i*. In some embodiments, sensor 114 may be used to determine the temperature of dynamic optical component 116*i* when the temperature of memory component 104*i* (e.g., as detected by sensor 114*i*) is a first constraint temperature of an operating temperature range of memory component 104*i*. For example, during the manufacture of device 100, the temperature of memory component 104*i* may be brought to a first temperature constraint (e.g., by operating memory component 104*i* or any other component of device 100 in any suitable way), and the temperature of dynamic optical component 116*i* may then be measured. Then, dynamic optical component 116*i* may be configured such that it may be in a first optical state when the temperature of dynamic optical component 116*i* is less than the determined temperature, and such that it may be in a second optical state when the temperature of dynamic optical component 116*i* is greater than the determined temperature. Therefore, by configuring dynamic optical component 116*i* to have at least one transition stimulus value that may be directly linked to a known operational value of another component of device 100 (e.g., an operating temperature threshold of memory component 104*i*), when that other component attains that known operational value, dynamic optical component 116*i* may automatically attain a transition stimulus value and transition between states.

It is to be understood that, although many of the examples provided herein may relate to thermally managing an electronic component of device 100 (e.g., solar cell component 108*a*, battery component 108*z*, memory component 104*i*, etc.), a dynamic optical component 116 may be adjusted to thermally manage any other suitable component of device 100, such as a display output component 112, communications circuitry 106, any other suitable electronic component, any suitable electro-mechanical component, or any purely mechanical component. For example, the reflectance, transmittance, and/or absorptance of one or more dynamic optical components 116 may be adjusted to thermally manage a mechanical button input component 110 of device 100 or a mechanical portion of a wall 120 of housing 101 of device 100, each of which may have its own operational restrictions, such as operating temperature thresholds.

It is also to be understood that a dynamic optical component 116 may be adjusted to manage characteristics of another device component that might not be considered for thermal management considerations. For example, rather than adjusting the reflectance/transmittance of a dynamic optical component 116 to manage a thermal characteristic of a device component (e.g., the operating temperature of battery component 108*z*), device 100 may be configured to adjust the reflectance/transmittance of a dynamic optical component 116 to manage another operational characteristic of a device component. Just as one example, battery component 108*z* may include an element that may not be exposed to electromagnetic radiation in the blue light spectrum, regardless of the heat content of such electromagnetic radiation. Therefore, electronic device 100 may be configured to adjust the transmittance of one or more of dynamic optical components 116*a*-116*i* of device 100 such that no electromagnetic radiation in the blue light spectrum may be transmitted towards battery component 108*z*.

In some embodiments, a dynamic optical component 116 may be adjusted to thermally manage itself rather than another component of device 100. For example, the reflectance or transmittance of a dynamic optical component 116 may be adjusted when an operational characteristic of that dynamic optical component 116 must be thermally managed. When the temperature of absorbed electromagnetic radiation 290*a* of dynamic optical component 116*a* exceeds a certain threshold (e.g., as may be detected by sensor 114*a*), device 100 may be configured to adjust the reflectance or transmittance of dynamic optical component 116*a* in order to reduce the temperature of absorbed electromagnetic radiation 290*a*. This may prevent an external surface of device 100 (e.g., external surface 117a of dynamic optical component 116a) from becoming too hot for a user to contact.

In some embodiments, a dynamic optical component 116 may be adjusted to manage characteristics of itself that might not be considered for thermal management considerations. For example, when the brightness, intensity, spectrum content, or any other characteristic of reflected electromagnetic radiation 290r provided by dynamic optical component 116a exceeds a certain threshold (e.g., as may be detected by sensor 114a), device 100 may be configured to adjust the reflectance, transmittance, and/or absorptance of dynamic optical component 116a in order to reduce that characteristic. This may prevent dynamic optical component 116a from reflecting electromagnetic radiation that may be undesirable to reflect towards a user or other entity external to device 100 that may be facing external surface 117a of dynamic optical component 116a.

For example, device 100 may be configured to prevent dynamic optical component 116a from being adjusted in such a way that a visible light portion of reflected electromagnetic radiation 290r may be aesthetically displeasing in the context of the appearance of housing 101 adjacent dynamic optical component 116a (e.g., the portion of external wall surface 121t of top wall 120t about opening 151). Therefore, in some embodiments, device 100 may be configured such that any adjustment of the reflectance/transmittance of a dynamic optical component 116 may be based on an appearance characteristic of at least a portion of the housing of the device. Additionally or alternatively, device 100 may be configured such that any adjustment of the reflectance/transmittance of a dynamic optical component 116 may be limited to its reflectance/transmittance of non-visible light (e.g., the adjustment of the reflectance/transmittance of a dynamic optical component 116 may be limited to its reflectance/transmittance of infrared electromagnetic radiation). In some embodiments, this limitation may only be imposed on dynamic optical components 116 that are configured to transmit and/or reflect electromagnetic radiation out from electronic device 100 (e.g., towards a user or other entity external to cavity 103 of housing 101 of device 100).

Thus, in addition to or as an alternative to controlling the adjustment of the reflectance/transmittance of a dynamic optical component 116 for managing one or more characteristics of another component of device 100 (e.g., the operating temperature of battery component 108z), device 100 may be configured to control the adjustment of the reflectance/transmittance of a dynamic optical component 116 for managing one or more characteristics of the dynamic optical component 116 itself (e.g., its temperature, the content of its reflected electromagnetic radiation, and the like).

Electronic device 100 may use any suitable approach or algorithm for analyzing and interpreting the detected characteristics of various components for thermally managing device 100. In some embodiments, processor 102 may load a thermal management application (e.g., an application of computer-readable media stored in memory 104 or provided to device 100 by a remote server via communications circuitry 106). The thermal management application may provide device 100 with rules for utilizing the various types of data that may be detected by one or more sensors 114 (e.g., the operating temperature of battery component 108z, the amount of power stored in battery component 108z, characteristics of the incident, reflected, transmitted, and absorbed electromagnetic radiation of one or more dynamic optical components 116, the relative positions of dynamic optical components 116 with respect to battery component 108z, and the like). For example, the rules may determine how device 100 analyzes this data in order to determine how to adjust the transmittance, reflectance, and/or absorption of one or more dynamic optical components 116 to thermally manage device 100 given the detected conditions.

Figure 3:
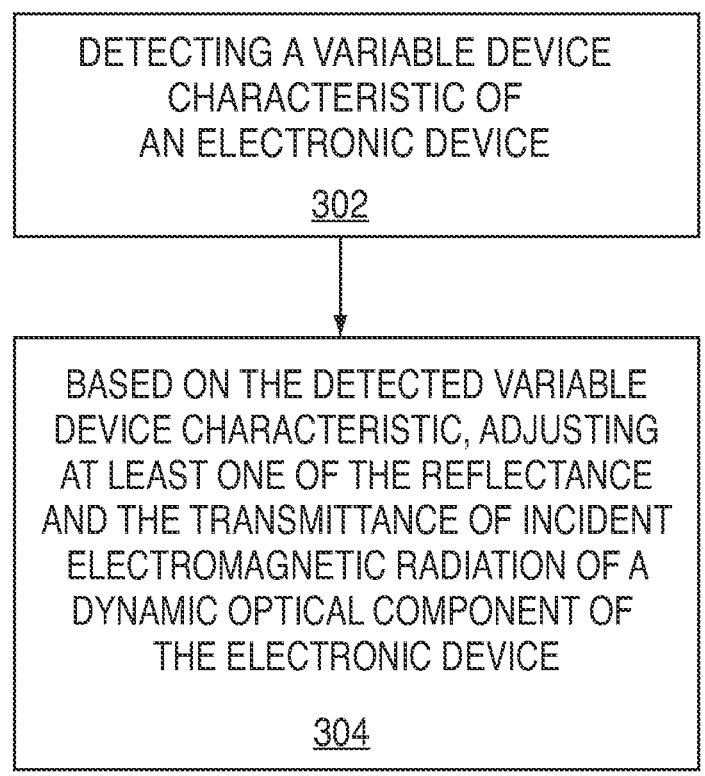
FIG. 3 is a flowchart of an illustrative process for thermally managing an electronic device in accordance with some embodiments of the invention.

FIG. 3 is a flowchart of an illustrative process 300 for thermally managing an electronic device. At step 302, a variable device characteristic of the electronic device may be detected. For example, any suitable variable characteristic of an electronic device may be detected using any suitable approach. In some embodiments, as shown in FIGS. 1 and 2, an electronic device 100 may include one or more sensors 114, each of which may be configured to detect one or more variable device characteristics of electronic device 100, such as a variable characteristic related to a current operation, performance, and/or environmental condition of one or more components or locations of electronic device 100 that may be useful for controlling the thermal management of electronic device 100. For example, a variable device characteristic may be the temperature of a portion of an electronic device, an application characteristic related to the current operation of one or more components of the electronic device (e.g., whether or not a power supply component is fully charged, what application program is currently being run by a processor, etc.), a characteristic of electromagnetic radiation being received, transmitted, reflected, and/or absorbed by a dynamic optical component or any other component of the electronic device, a characteristic related to the orientation or velocity of the electronic device, a characteristic related to the amount or type of light, heat, or sound that a portion of the electronic device is currently being exposed to, and the like.

At step 304, based on the variable device characteristic detected at step 302, at least one of the reflectance and the transmittance of incident electromagnetic radiation of a dynamic optical component of the electronic device may be adjusted. For example, any suitable dynamic optical component may adjust its reflectance and/or its transmittance of incident electromagnetic radiation using any suitable approach. In some embodiments, as shown in FIGS. 1 and 2, an electronic device 100 may include one or more dynamic optical components 116, each of which may be modified to adjust the reflectance and/or transmittance of a certain portion of incident electromagnetic radiation independently from the reflectance and/or transmittance of another portion of the incident electromagnetic radiation. For example, a dynamic optical component 116 may be modified to adjust its reflectance of the infrared radiation spectrum portion of incident electromagnetic radiation while not adjusting its reflectance of the visible light radiation spectrum portion of the incident electromagnetic radiation. By adjusting the reflectance of a dynamic optical component 116, the amount of incident electromagnetic radiation transmitted through the dynamic optical component 116 may be adjusted as well.

The adjustment of the reflectance and/or transmittance of a dynamic optical component may control how much of the incident electromagnetic radiation may be passed through the dynamic optical component and passed onto or received by another portion or component of the electronic device. A dynamic optical component can take a variety of forms and its reflectance and/or transmittance may be adjusted in a variety of ways, including, but not limited to, a MEMS and/or NEMS of one or more shutters that may be at least partially opened or closed, an evaporative liquid that may turn to a reflective gas, any suitable system including one or more chromic elements or substances that may be adjusted in any suitable way, or any combinations thereof. An adjustment of a dynamic optical component's reflectance and/or transmittance may result from a process caused by any suitable stimulus, such as a temperature change, an applied electrical current, an exposure to electromagnetic radiation, and the like.

The adjustment of the reflectance and/or transmittance of a dynamic optical component may be based on the detected variable device characteristic. For example, as mentioned with respect to FIGS. 1 and 2, an electronic device 100 may include a processor 102 that may control the reflectance and/or transmittance of a dynamic optical component 116 based on information detected by a sensor 114, such as information related to the operating temperature of a battery component 108 of device 100. In some embodiments, when the operating temperature of a power supply component is detected to have increased above a certain upper threshold temperature of an operating temperature range of the power supply component, a processor of the electronic device may be configured to consequentially increase the reflectance of a dynamic optical component (e.g., a dynamic optical component that may be positioned between a source of electromagnetic radiation and the power supply component).

In some embodiments, the variable device characteristic detected at step 302 may be the temperature of a portion of the electronic device. For example, such a portion of the electronic device may be at least one of a power supply of the electronic device, a memory component of the electronic device, the dynamic optical component of the electronic device, and a housing of the electronic device. In some other embodiments, the detecting of step 302 may include detecting the variable device characteristic within a cavity that may be defined by a housing of the electronic device, and the incident electromagnetic radiation may be from a source that may be external to the cavity (e.g., the sun).

Moreover, in some embodiments, the adjusting of step 304 may include increasing the percentage of a first spectrum band of the incident electromagnetic radiation that is transmitted through the dynamic optical component. Additionally or alternatively, the adjusting of step 304 may include decreasing the percentage of a second spectrum band of the incident electromagnetic radiation that is transmitted through the dynamic optical component. Moreover, the adjusting of step 304 may change the variable device characteristic. In other embodiments, the adjusting of step 304 may include adjusting the reflectance and/or transmittance when the detected variable device characteristic is above an upper threshold value or when the detected variable device characteristic is below a lower threshold value. Alternatively, the adjusting of step 304 may include heating the dynamic optical component to a temperature above a first transition temperature or cooling the dynamic optical component to a temperature below a second transition temperature. In yet other embodiments, the adjusting of step 304 may include applying a first electrical charge to the dynamic optical component that is above a first transition charge or applying a second electrical charge to the dynamic optical component that is below a second transition charge. In still yet other embodiments, the adjusting of step 304 may include adjusting the reflectance and/or the transmittance of a first spectrum band of the incident electromagnetic radiation by a first amount and adjusting the reflectance and/or the transmittance of a second spectrum band of the incident electromagnetic radiation by a second amount. In still yet other embodiments, the incident electromagnetic radiation may be from a source that may be external to a cavity that may be defined by a housing of the electronic device, and the adjusting of step 304 may include adjusting the reflectance and/or the transmittance based on both the detected variable device characteristic and an appearance of at least a portion of the housing. For example, the reflectance may only be adjusted so as not to create a displeasing effect when viewed in relationship to the appearance of the housing.

In some embodiments, process 300 may also include adjusting the reflectance and/or the transmittance of second incident electromagnetic radiation of a second dynamic optical component of the electronic device based on the detected variable device characteristic. For example, the device may include multiple dynamic optical components, and the transmittance and/or reflectance of each may be adjusted based on a detected variable characteristic. In other embodiments, process 300 may also include detecting a second characteristic of a second dynamic optical component of the electronic device, and the adjusting of step 304 may include adjusting the transmittance and/or reflectance based on both the detected variable device characteristic and the detected second characteristic. For example, the device may include multiple dynamic optical components, and the transmittance and/or reflectance of a first dynamic optical component may be adjusted based on a characteristic of a second dynamic optical component.

It is understood that the steps shown in process 300 of FIG. 3 are merely illustrative and that existing steps may be modified or omitted, additional steps may be added, and the order of certain steps may be altered.

Figure 4:
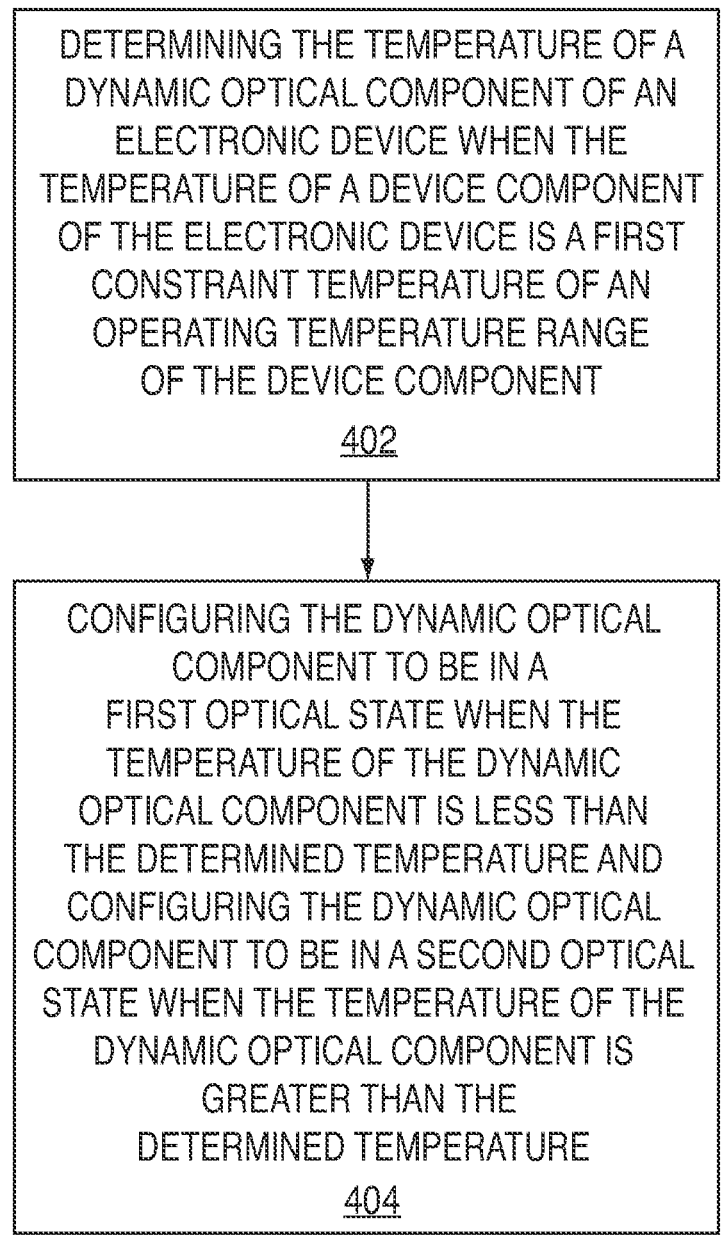
FIG. 4 is a flowchart of an illustrative process for thermally managing an electronic device in accordance with some other embodiments of the invention.

FIG. 4 is a flowchart, of an illustrative process 400 for thermally managing an electronic device. At step 402, the temperature of a dynamic optical component of the electronic device may be determined when the temperature of a device component of the electronic device is a first constraint temperature of an operating temperature range of the device component. For example, a temperature of a dynamic optical component may be determined using any suitable approach. In some embodiments, as shown in FIGS. 1 and 2, an electronic device 100 may include one or more sensors 114, each of which may be configured to determine a temperature of a particular portion of device 100. For example, a dynamic optical component 116$i$ may be provided with a sensor 114$i'$ that may be configured to determine the temperature or any other characteristic of dynamic optical component 116$i$. In some embodiments, sensor 114$i'$ may be used to determine the temperature of dynamic optical component 116$i$ when the temperature of memory component 104$i$ (e.g., as detected by sensor 114$i$) is a first constraint temperature of an operating temperature range of memory component 104$i$.

Next, at step 404, the dynamic optical component may be configured to be in a first optical state when the temperature of the dynamic optical component is less than the temperature determined at step 402, and the dynamic optical component may be configured to be in a second optical state when the temperature of the dynamic optical component is greater than the temperature determined at step 402. For example, with reference to FIGS. 1 and 2, dynamic optical component 116$i$ may be configured such that it may be in a first optical state when the temperature of dynamic optical component 116$i$ is less than the temperature of dynamic optical component 116$i$ that was determined when the temperature of memory component 104$i$ was a first constraint temperature of the operating temperature range of memory component 104$i$. Moreover, dynamic optical component 116$i$ may be configured such that it may be in a second optical state when the temperature of dynamic optical component 116$i$ is greater than the temperature of dynamic optical component 116$i$ that was determined when the temperature of memory component 104$i$ was a first constraint temperature of the operating temperature range of memory component 104$i$. The first optical state of the dynamic optical component may be defined by a first reflectance, a first transmittance, and a first absorptance of incident electromagnetic radiation, while the second optical state of the dynamic optical component may be defined by a second reflectance, a second transmittance, and a second absorptance of incident electromagnetic radiation, and at least one of the first reflectance and the first transmittance may be different than a respective one of the second reflectance and the second transmittance for a particular incident electromagnetic radiation.

In some embodiments, the device component of process 400 may be a power supply of the electronic device. Additionally or alternatively, the dynamic optical component of process 400 may be a thermochromic system. When the dynamic optical component is in the first optical state, the dynamic optical component may be configured to transmit a first percentage of a first portion of incident electromagnetic radiation, and when the dynamic optical component is in the second optical state, the dynamic optical component may be configured to transmit a second percentage of the first portion of the incident electromagnetic radiation. In some embodiments, the first percentage may be greater than the second percentage. Additionally or alternatively, a heat component of the first percentage may be greater than a heat component of the second percentage.

It is understood that the steps shown in process 400 of FIG. 4 are merely illustrative and that existing steps may be modified or omitted, additional steps may be added, and the order of certain steps may be altered.

The processes described with respect to FIGS. 3 and 4, as well as any other aspects of the invention, may each be implemented by software, but may also be implemented in hardware, firmware, or any combination of software, hardware, and firmware. They each may also be embodied as computer-readable code recorded on a computer-readable medium. The computer-readable medium may be any data storage device that can store data which can thereafter be read by a computer system. Examples of the computer-readable medium include read-only memory, random-access memory, flash memory, CD-ROMs, DVDs, magnetic tape, and optical data storage devices (e.g., memory 104 of FIG. 1). The computer-readable medium can also be distributed over network-coupled computer systems so that the computer-readable code may be stored and executed in a distributed fashion. For example, the computer-readable medium may be communicated from one electronic device to another electronic device using any suitable communications protocol (e.g., the computer-readable medium may be communicated to electronic device 100 via communications circuitry 106). The computer-readable medium may embody computer-readable code, instructions, data structures, program modules, or other data in a modulated data signal, such as a carrier wave or other transport mechanism, and may include any information delivery media. A modulated data signal may be a signal that has one or more of its characteristics set or changed in such a manner as to encode information in the signal.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The above-described embodiments of the invention are presented for purposes of illustration and not of limitation.

What is claimed is:

1. A method for operating a hand-held electronic device according to an amount of electromagnetic radiation that is incident upon the hand-held electronic device, the method comprising:
by the hand-held electronic device:
determining that a dynamic optical component of the hand-held electronic device is operating at a peak reflectance to reflect electromagnetic radiation incident upon the hand-held electronic device; and
limiting a load of the hand-held electronic device when an output of the load is above a threshold value.

2. The method of claim 1, further comprising:
varying, based on a temperature of at least a portion of the hand-held electronic device, a reflectance of the dynamic optical component to increase or decrease an amount of electromagnetic radiation absorbed by the hand-held electronic device.

3. The method of claim 1, wherein the load is a power supply connected to the hand-held electronic device.

4. The method of claim 1, further comprising:
when the output of the load falls below the threshold value, withdrawing a limit applied to the load.

5. The method of claim 1, further comprising:
when the output of the load falls below the threshold value, decreasing a reflectance of the dynamic optical component.

6. The method of claim 1, wherein the output of the load is a thermal output.

7. The method of claim 6, further comprising:
monitoring a temperature reading of a temperature sensor of the hand-held electronic device to determine the thermal output of the load.

8. A hand-held computing device, comprising:
a dynamic optical component configured to reflect electromagnetic radiation incident upon the hand-held electronic device; and
a processor configured to limit a load of the hand-held electronic device when an output of the load is above a threshold value.

9. The hand-held computing device of claim 8, wherein the dynamic optical component is further configured to vary in reflectance based on a temperature of at least a portion of the hand-held electronic device.

10. The hand-held computing device of claim 8, wherein the load is a power supply connected to the hand-held electronic device.

11. The hand-held computing device of claim 8, wherein the processor is further configure to withdraw a restriction applied to the load when the output of the load falls below the threshold value.

12. The hand-held computing device of claim 8, wherein the dynamic optical component is configured to decrease in reflectance when the output of the load falls below the threshold value.

13. The hand-held computing device of claim 8, wherein the output of the load is a thermal output.

14. The hand-held computing device of claim 13, wherein the processor is further configured to monitor a temperature reading of a temperature sensor of the hand-held electronic device to determine the thermal output of the load.

15. A method for operating a hand-held electronic device according to an amount of electromagnetic radiation that is incident upon the hand-held electronic device, the method comprising:
by the hand-held electronic device:
increasing a load of the hand-held electronic device when an output of the load falls below a predetermined threshold; and
decreasing a reflectance of a dynamic optical component to reduce an amount of electromagnetic radiation that is reflected from the hand-held electronic device.

16. The method of claim 15, wherein the load is a power supply connected to the hand-held electronic device and the output of the load is a thermal output.

17. The method of claim 15, further comprising:
increasing the reflectance of the dynamic optical component when the output of the load rises above the predetermined threshold value.

18. The method of claim 17, further comprising:
monitoring a sensor of the hand-held electronic device to determine the output of the load.

19. The method of claim 15, wherein increasing the load comprises increasing an amount of charge provided to or from the load.

20. The method of claim 15, wherein decreasing a reflectance of the dynamic optical component comprises reflecting less electromagnetic radiation of a predetermined spectrum band.

\* \* \* \* \*